(12) United States Patent
Kuo et al.

(10) Patent No.: US 9,310,255 B2
(45) Date of Patent: Apr. 12, 2016

(54) MATRIX THERMAL SENSING CIRCUIT AND HEAT DISSIPATION SYSTEM

(71) Applicant: ASUSTeK COMPUTER INC., Taipei (TW)

(72) Inventors: Chung-Wei Kuo, Taipei (TW); Kuo-Chen Huang, Taipei (TW); Kuan-Kun Tang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 208 days.

(21) Appl. No.: 14/144,506

(22) Filed: Dec. 30, 2013

(65) Prior Publication Data

US 2014/0198451 A1    Jul. 17, 2014

(30) Foreign Application Priority Data

Jan. 16, 2013   (TW) ............................... 102101648 A

(51) Int. Cl.
  *H05K 7/20* (2006.01)
  *G01K 1/02* (2006.01)
  *G06F 1/20* (2006.01)

(52) U.S. Cl.
  CPC .............. *G01K 1/026* (2013.01); *G06F 1/206* (2013.01); *H05K 7/20209* (2013.01); *G01K 2217/00* (2013.01); *Y02B 60/1275* (2013.01)

(58) Field of Classification Search
  CPC . H05K 7/20172; H05K 7/20209; G01K 7/00; G01K 1/026; G01K 2217/00; G06F 1/206; Y02B 60/1275
  USPC ............................ 361/688–723, 805; 374/183
  See application file for complete search history.

(56) References Cited

U.S. PATENT DOCUMENTS

| | | | | |
|---|---|---|---|---|
| 5,456,608 | A * | 10/1995 | Rogers .................... | H01R 29/00 29/845 |
| 6,188,189 | B1 * | 2/2001 | Blake ..................... | F04D 27/004 318/268 |
| 7,789,130 | B2 | 9/2010 | Chen | |
| 2004/0199797 | A1 * | 10/2004 | Vuong ............... | H05K 7/20209 713/300 |
| 2006/0013281 | A1 * | 1/2006 | Sri-Jayantha ........... | G06F 1/206 374/163 |
| 2007/0073510 | A1 * | 3/2007 | Kerkman ............... | G01K 7/425 702/130 |
| 2007/0168151 | A1 * | 7/2007 | Kernahan ............... | G01K 7/425 702/132 |
| 2009/0323763 | A1 * | 12/2009 | Raychowdhury ...... | G01K 7/015 374/170 |
| 2013/0018523 | A1 * | 1/2013 | Rubenstein ........ | G05D 23/1919 700/300 |

FOREIGN PATENT DOCUMENTS

CN            101086670 A    12/2007

* cited by examiner

*Primary Examiner* — Anthony Haughton
*Assistant Examiner* — Yahya Ahmad
(74) *Attorney, Agent, or Firm* — CKC & Partners Co., Ltd.

(57) ABSTRACT

A heat-dissipation system and a matrix thermal sensing circuit are provided. The heat-dissipation is used in an electronic device. The electronic device comprises a circuit board and a plurality of load elements disposed on the circuit board. The matrix thermal sensing circuit includes a current sensing module and a calculation module. The current sensing module includes a plurality of sensing nodes. Each sensing node is electrically connected to a current feeding terminal of one corresponding load element, and senses the working current of the corresponding load element respectively. The calculation module is connected to the current sensing module and is used to determine thermal state of the location of the sensing node according to the working current respectively.

5 Claims, 5 Drawing Sheets

| working current (A) | input power (W) | output power (W) |
|---:|---:|---:|
| 0.21 | 2.57 | 0 |
| 0.97 | 11.83 | 8.94 |
| 1.69 | 20.58 | 17.82 |
| 2.44 | 29.67 | 26.66 |
| 3.21 | 39.00 | 35.43 |
| 4 | 48.52 | 44.13 |
| 4.77 | 57.76 | 52.80 |
| 5.53 | 66.86 | 61.39 |
| 6.33 | 76.47 | 69.92 |
| 7.1 | 85.63 | 78.44 |
| 7.88 | 94.88 | 86.85 |
| 8.67 | 104.21 | 95.21 |
| 9.46 | 113.52 | 103.56 |
| 10.23 | 122.66 | 111.80 |
| 11.03 | 132.03 | 119.98 |
| 11.8 | 141.01 | 128.10 |
| 12.61 | 150.31 | 136.24 |
| 13.41 | 159.58 | 144.25 |
| 14.17 | 168.34 | 152.28 |
| 14.99 | 177.78 | 160.17 |

MATRIX THERMAL SENSING CIRCUIT AND HEAT DISSIPATION SYSTEM

CROSS-REFERENCE TO RELATED APPLICATION

This application claims the priority benefit of Taiwan application serial No. 102101648, filed on Jan. 16, 2013. The entirety of the above-mentioned patent application is hereby incorporated by reference herein and made a part of specification.

BACKGROUND OF THE INVENTION

1. Field of the Invention

The disclosure relates to a heat-dissipation system and, more particularly, to a matrix thermal sensing circuit used in an electronic device and a heat-dissipation system.

2. Description of the Related Art

The complexity of the precision electronic system increases with the evolution of electronic technique. Whether the operation of the electronic computing devices is normal and accurate is closely related to the operating environment; especially the ambient temperature. Accordingly, the heat dissipation of the electronic system becomes more important.

Conventionally, cooling fans are set in the electronic system to exhaust heat air generated by the heat source outside of the electronic system via convection. Generally, the fan in the electronic system operating at the highest speed has a higher power consumption and larger operation noise. Accordingly, in order to save energy and reduce noise, the fans in the advanced electronic systems usually are not fixed at the highest speed when operating, and the speed can be adjusted according to the sensing result of the thermal sensors in the electronic system.

Multiple fans may be set in the larger computer systems (such as industrial computers or servers), while all the fans are set at a same setting condition via a single thermal sensor, the computer system cannot dissipate heat with the best efficiency and may consume unnecessary energy.

BRIEF SUMMARY OF THE INVENTION

A matrix thermal sensing circuit for sensing thermal distribution of a circuit board is provided. The circuit board includes a plurality of load elements. The matrix thermal sensing circuit includes a current sensing module and a calculation module.

The current sensing module includes a plurality of sensing nodes. Each sensing node is electrically connected to a current feeding terminal of one corresponding load element and senses the working current of the corresponding load element respectively. The calculation module is connected to the current sensing module and used to determine the thermal state of the location of the sensing node according to the working current respectively.

A heat-dissipation system used in an electronic device is also provided. The electronic device comprises a circuit hoard and a plurality of load elements disposed on the circuit board. The heat-dissipation system includes a matrix thermal sensing circuit, a fan module and a fan control circuit. The matrix thermal sensing circuit includes a current sensing module and a calculation module.

The current sensing module includes a plurality of sensing nodes. Each sensing node is electrically connected to a current feeding terminal of one corresponding load element and senses the working current of the corresponding load element.

The calculation module is connected to the current sensing module and used to determine the thermal state of the location of the sensing node according to the working current respectively.

The fan module includes a plurality of first fan units. The first fan units are disposed at different positions around the circuit board along a first direction.

The fan control circuit is electrically connected to the calculation module and the fan module.

According to the description above, the matrix thermal sensing circuit senses the working current of each load element through a set of sensing nodes disposed at different positions on the circuit board, and determines the thermal state of the different locations of the circuit board. In addition, the sensing results of the matrix thermal sensing circuit can be used to control the fan units disposed at different positions and to adjust the operating parameters of the fan units to the optimum operating parameters.

BRIEF DESCRIPTION OF THE DRAWINGS

FIG. 5 is an efficiency lookup table in an embodiment.

DETAILED DESCRIPTION OF THE EMBODIMENTS

These and other features, aspects, and advantages of the present disclosure will become better understood with regard to the following description, appended claims, and accompanying drawings. Persons having ordinary skill in the art may make various modifications and changes without departing from the scope and spirit of the disclosure.

Figure 1:
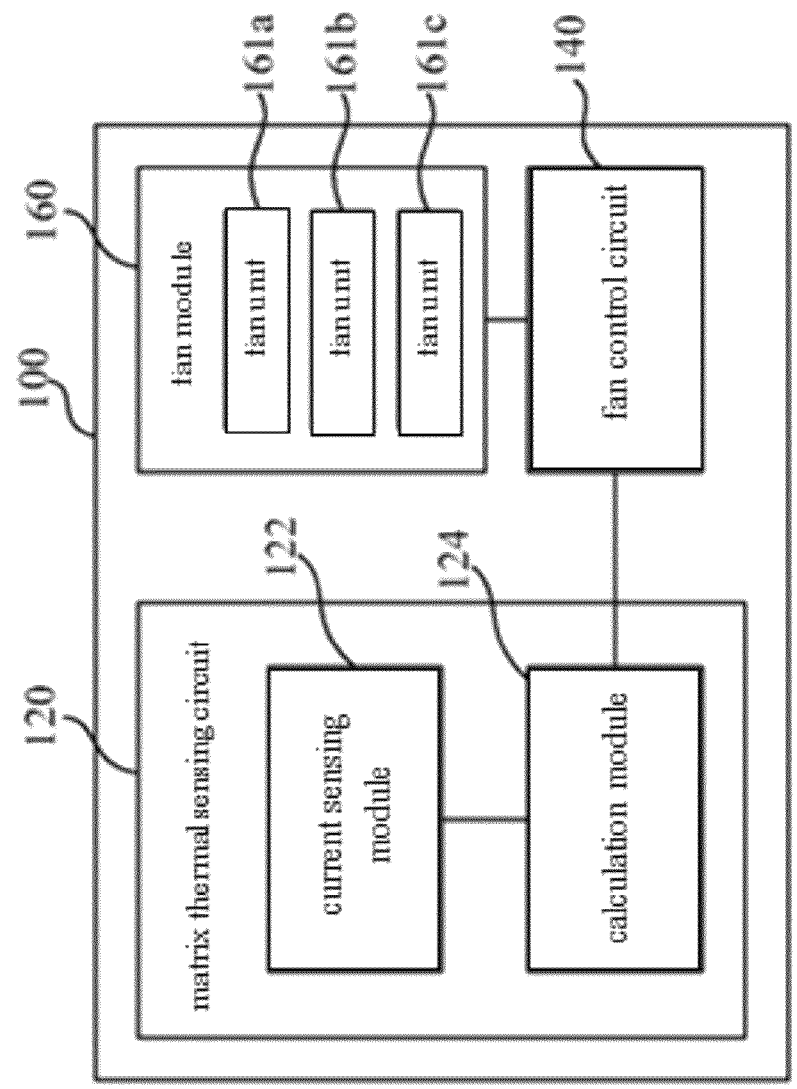
FIG. 1 is a schematic diagram showing a heat-dissipation system in an embodiment.

FIG. 1 is a schematic diagram showing a heat-dissipation system 100 in an embodiment. The heat-dissipation system 100 includes a matrix thermal sensing circuit 120, a fan control circuit 140 and a fan module 160.

The matrix thermal sensing circuit 120 includes a current sensing module 122 and a calculation module 124. The fan module 160 includes a plurality of fan units, such as fan units 161a, 161b, and 161c. The fan control circuit 140 is electrically connected to the calculation module 122 and the fan module 160.

The heat-dissipation system 100 may be used for heat-dissipation in electronic devices. In general, electronic devices (such as computer system, industrial computer, server, etc.) include circuit boards and a plurality of load elements.

Figure 2:
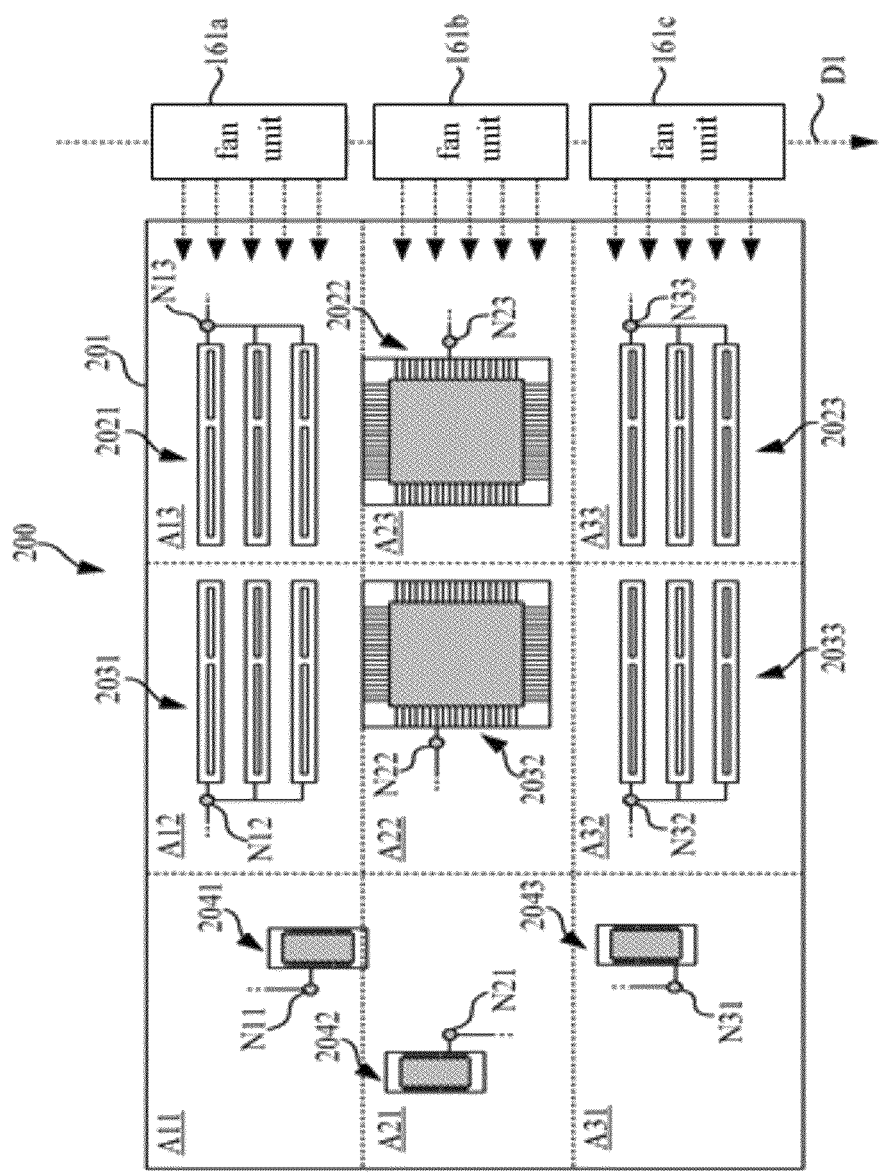
FIG. 2 is a schematic diagram showing an electronic device according to the heat-dissipation system shown in FIG. 1.

FIG. 2 is a schematic diagram showing an electronic device 200 according to the heat-dissipation system 100 shown in FIG. 1. As shown in FIG. 2, the electronic device 200 includes a circuit board 201 and a plurality of load elements 2021 to 2043 disposed on the circuit board 201. The load elements 2021 to 2043 generate heat when electrical signals are transmitted through the load elements 2021 to 2043 for driving the load elements 2021 to 2043 to work.

For example, the load elements 2022 and 2032 may be central processing unit (CPU) chips, the load elements 2021, 2023, 2031 and 2033 may be memory modules, the load elements 2041 to 2043 may be system chipsets, which is not limited herein, and the load elements may further include any equivalence load that can consume power and generate heat.

Please Refer to FIG. 1 and FIG. 2, the current sensing module 122 in the matrix thermal sensing circuit 120 includes a plurality of sensing nodes (such as the sensing nodes N11 to N33 in FIG. 2).

As shown in FIG. 2, the circuit board 210 is divided to nine blocks A11, A12, A13, A21, A22, A23, A31, A32 and A33 according to the horizontal/vertical direction. It should be noted that the circuit board 201 divided into nine blocks is just an example, which is not limited herein.

That is, the circuit 201 may be divided to M first segments along the horizontal direction and divided to N second segments along the vertical direction, thus, the circuit board 201 forms M*N blocks in the manner of matrix and the sensing nodes are disposed in the different blocks of the circuit board 201. Wherein the M, N are positive integers, for example, M=3 and N=3.

For example, the sensing node N11 is disposed in block A11 of the circuit board 201 and electrically connected to the current feeding terminal of load element 2041; the sensing node N12 is disposed in block A12 of the circuit board 201 and electrically connected to the current feeding, terminal of load element 2031; the sensing node N13 is disposed in block A13 of the circuit board 201 and electrically connected the current feeding terminal of load element 2021, the configuration of the other load elements are in the same manner.

In other words, every sensing node N11 to N33 is electrically connected to the current feeding terminal of one of the load elements 2021 to 2043, and sensing nodes N11 to N33 are disposed at different positions of the circuit board 201. The current sensing module 122 senses the working current of every load element 2021 to 2043 through via sensing nodes N11 to N33.

The calculation module 124 is coupled to the current sensing module 122, which is used to determine the thermal state of the location of the sensing node N11 to N33 according to the working current.

For example, the calculation module 124 looks up an efficiency lookup table according to the working current of the sensing nodes N11 to N33 to obtain the corresponding power loss, and it also can obtain the thermal state of the location where the sensing node is according to the corresponding power loss of the sensing nodes N11 to N33.

The efficiency lookup table includes the input power and the output power of each load element with different working current. The power loss and the corresponding converted heat can be calculated according to the input power and the output power. FIG. 5 illustrates the efficiency lookup table in an embodiment.

For example, the sensing node of the current sensing module 122 can be achieved by a bi-directional current/power monitor.

In general, the power loss of the working current are mostly converted to heat and dissipated, the larger difference between the input power and the output power is, the more the heat generated by the load elements is.

The calculation module 124 can obtain the power loss under different working current (the difference between the input power and the output power), and obtain the thermal state of the location of the corresponding sensing nodes N11 to N33 according to the lookup table.

In FIG. 2, the fan module 160 includes three fan units 161a, 161b and 161c, the fan units are corresponding to different blocks on the circuit board 201 along a first direction D1. For example, the fan unit 161a is corresponding to block A11, block A12 and block A13; the fan unit 161b is corresponding to block A21, block A22 and block A23; the fan unit 161c is corresponding to block A31, block A32 and block A33.

As shown in FIG. 1 and FIG. 2, the fan control circuit 140 is electrically connected to the calculation module 124 and the fan module 160. The fan control circuit 140 gets the heat distribution of different positions of the circuit board 201 according to the thermal state of the location of each sensing node N11 to N33, and adjusts the operating parameters of the fan unit 161a, 161b and 161c. The sensing nodes N11 to N33 form the matrix thermal sensing architecture.

For example, the fan control circuit 140 can generate fan curves of the three fan unit 161a, 161b and 161c according to the heat distribution at different positions of the circuit board 201.

In other words, the fan curve of the three fan unit 161a, 161b and 161c can be represented by the following formula:

$$F(T_{11}, T_{12}, T_{13})_{thermal} = \text{FanCurve1}$$

$$F(T_{21}, T_{22}, T_{23})_{thermal} = \text{FanCurve2}$$

$$F(T_{31}, T_{32}, T_{33})_{thermal} = \text{FanCurve2}$$

Wherein, $T_{xy}$ represents the thermal state of the location of the sensing node $N_{xy}$, FanCurve1 to 3 are fan performance curves of the fan unit 161a, 161b and 161c.

When one of the sensing, nodes (N11 to N33) overheats, the fan control circuit 140 adjusts the operating parameters of one of the fan units according to the segment/block of the overheating sensing node. For example, while the sensing node N23 overheats, the sensing node N23 corresponds to the block A23 on the circuit board 201 and corresponds to the fan unit 161b in the segment of the horizontal direction, the fan control circuit 140 adjusts the operating parameters of the fan unit 161b.

In other words, while the current sensing module 122 senses the working current of the sensing node N21, N22 and/or N23 and determines that the power loss of the load element is great, the fan control circuit 140 accordingly adjusts the fan unit 161b to increase the rotate speed of the fan and enhance the dissipate effect. While the power loss of the load element is small, the fan control circuit 140 accordingly adjusts the fan unit 161b to decrease the rotate speed of the fan for lowering the power consumption and noise.

Figure 3:
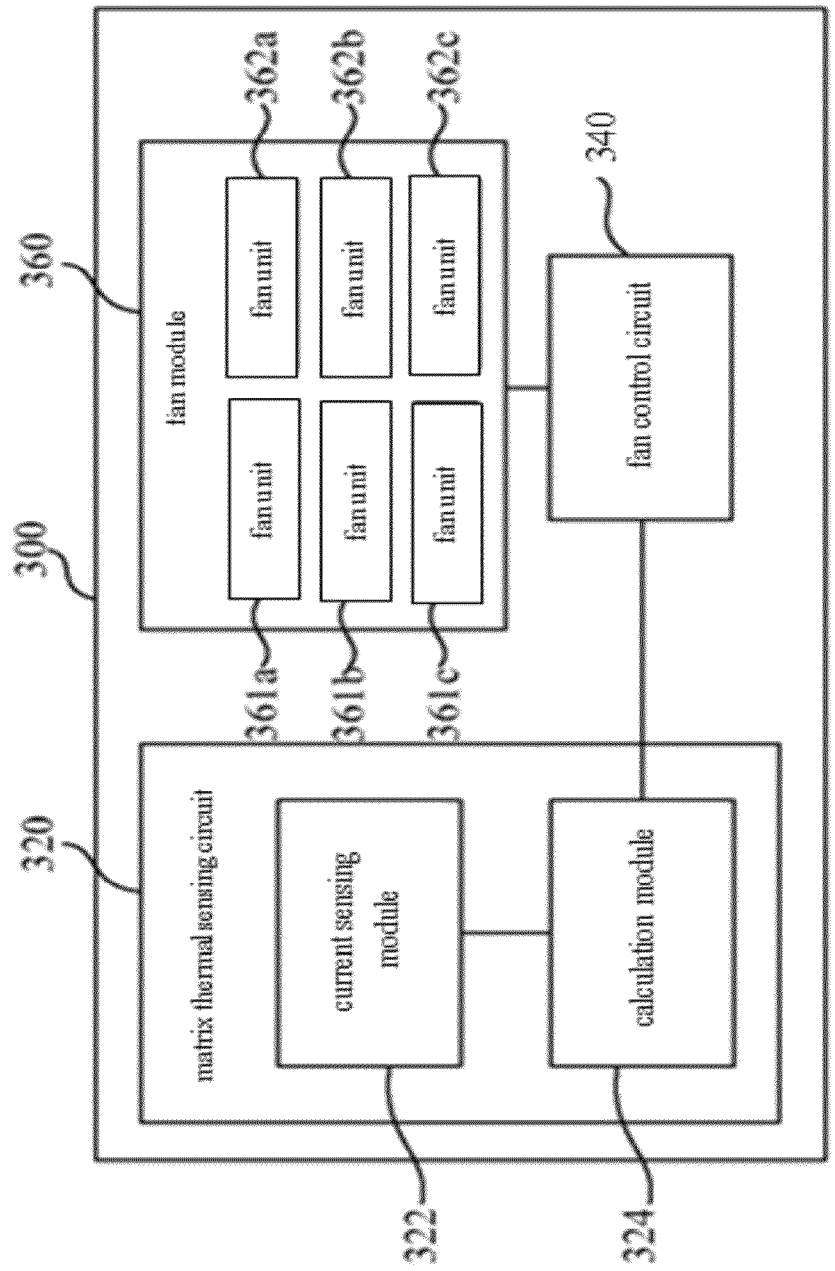
FIG. 3 is a schematic diagram showing a heat-dissipation system in another embodiment.
Figure 4:
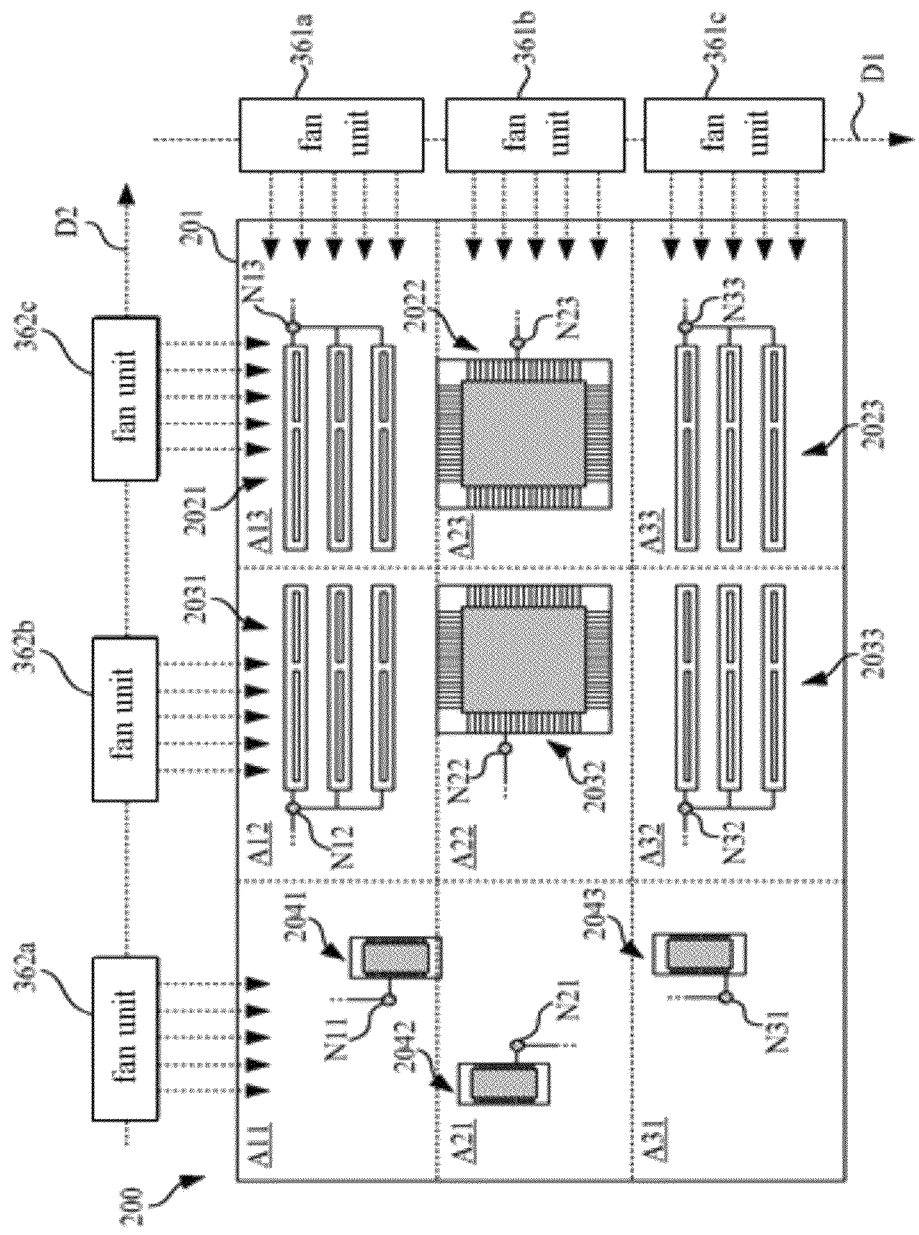
FIG. 4 is a schematic diagram showing an electronic device according to the heat-dissipation system shown in FIG. 3.

The fan module 160 includes a plurality of fan units 161a, 161b and 161c disposed along the first direction D1, which is not limited herein. Please refer to FIG. 3 and FIG. 4, FIG. 3 is a schematic diagram showing a heat-dissipation system 300 in another embodiment; FIG. 4 is a schematic diagram showing an electronic device 200 according to the heat-dissipation system 300 shown in FIG. 3.

In FIG. 3, the heat-dissipation system 300 includes a matrix thermal sensing circuit 320, a fan control circuit 340 and a fan module 360. The operation and the function are similar to these of the heat-dissipation system 100. The main difference is the fan module 360 includes fan units 361a, 361b and 361c and fan unit 362a, 362b and 362c.

As shown in FIG. 4, except the fan units 361a, 361b and 361c disposed around the circuit board 201 along the first direction D1, the fan module 360 further includes fan unit 362a, 362b and 362c which are disposed at different positions around the circuit board 201 along the second direction D2.

The fan control circuit 340 is used to adjust the operating parameters of the fan units 361*a*, 361*b*, 361*c* and fan unit 362*a*, 362*b* and 362*c*.

In the embodiment, the fan units 361*a*, 361*b*, 361*c*, 362*a*, 362*b*, and 362*c* respectively correspond to different combinations of the blocks on the circuit board 201.

The fan unit 361*a* corresponds to block A11, A12 and A13; the fan unit 361*b* is corresponds to block A21, A22 and A23; the fan unit 361*c* corresponds to block A31, A32 and A33. The fan unit 362*a* corresponds to block A11, A21 and A31; the fan unit 362*b* corresponds to block A12, A22 and A32; the fan unit 362*c* corresponds to block A13, A23 and A33. Thus, the fan units 361*a*, 361*b* and 361*c* and the fan units 362*a*, 362*b* and 362*c* form the matrix fan cooling architecture.

For example, the fan control circuit 340 can generate fan curves of the fan units 361*a*, 361*b* and 361*c* and the fan units 362*a*, 362*b* and 362*c* according to the heat distribution of different positions of the circuit board 201. The fan curve can be represented by the following formula:

$$F\begin{Bmatrix} T_{11} & T_{13} & T_{13} \\ T_{21} & T_{22} & T_{23} \\ T_{31} & T_{32} & T_{33} \end{Bmatrix} = FanCurve(x)$$

Wherein, $T_{xy}$ represents the thermal state of the location of the sensing node $N_{xy}$, Fan Curve(x) are curves of the fan performance of the fan units 361*a*, 361*b*, 361*c*, 362*a*, 362*b*, and 362*c*.

In the embodiment of the FIG. 3 and FIG. 4, when one of the sensing nodes overheats, the fan control circuit 340 adjusts the operating parameter of one of the fan units 361*a*, 361*b*, and 361*c*, and one of the fan units 362*a*, 362*b*, 362*c* according to the segment/block that the overheated sensing node positioned.

For example, while the sensing node N23 overheats, the sensing node N23 corresponds to the block A23 on the circuit board 301 and corresponds to the fan units 361*b* and 362*c* in the segment of the horizontal direction and the segment of the vertical direction, respectively, the fan control circuit 340 adjusts the operating parameters of the fan unit 361*b* and 362*c*.

The above formula generates a plurality of fan performance curves conforming to the actual temperature. Thus, the fan performance curves can be used to design the fan operating mode under different user scenarios.

In the embodiment in FIG. 1 and FIG. 3, the fan control circuit 140/340 further controls the fan module 160/360 according to a plurality of operating modes. For example, the operating mode includes at least one of the silent mode, a power-saving mode, a high-performance mode, a single-processor mode, a multi-processor mode, a user-definable modes and a self-test mode.

The silent mode means that the fan units operate at low speed to reduce the noise while the environment allows (such as lower operating temperature). However, while the load becomes heavy (for example, the working current of one sensing node exceeds a predetermined value), the silent mode can be closed (such as converted to high-performance mode).

The power-saving mode means in specific load conditions, each fan unit is selectively closed or sequentially opened to save energy according to the working current feedback by all the sensing nodes.

The high-performance mode means that the fan units work at the highest speed.

The single-processor mode/multi-processor mode means that a set of fan performance curves are generated according to the temperature near a specific important load element (such as a central processing unit), to correspond to a single processor mode or multi-processors for achieving better heat dissipation effect and save energy.

The user-definable mode means that the mode is adjusted according to user's requirement or usage condition, such as using high-performance mode at daytime and using silent mode at night.

The self-test mode means executing all the fans every three months, the temperature region does not meet the preset temperature gradient (heat dissipation effect is less than the preset threshold) when the function is activated, it sends out a warning signal to facilitate fan maintenance.

Although the present disclosure has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A heat-dissipation system used in an electronic device, wherein the electronic device comprises a circuit board and a plurality of load elements disposed on the circuit board, comprising:
   a matrix thermal sensing circuit, including:
   a current sensing module including a plurality of sensing nodes, wherein each sensing node is electrically connected to a current feeding terminal of one corresponding load element and senses the working current of the corresponding load element; and
   a calculation module connected to the current sensing module and used to determine the thermal state of the location of each of the sensing nodes according to the corresponding working current;
   a fan module; and
   a fan control circuit electrically connected to the calculation module and the fan module,
   wherein the circuit board is divided into N first segments along a first direction and M second segments along a second direction perpendicular to the first direction to form a matrix of M*N blocks, where M and N are integers greater than zero, each of the load elements being disposed on the circuit board in one of the blocks;
   wherein the fan module comprises a plurality of first fan units disposed at different positions around the circuit board along the first direction, and a plurality of second fan units disposed at different positions around the circuit board along the second direction, each of the first fan units being aligned in the second direction to a row of blocks of the circuit board, and each of the second fan units being aligned in the first direction to a column of blocks of the circuit board;
   wherein when the calculation module determines that one of the sensing nodes overheats, the fan control circuit controls one of the first fan units and one of the second an units in the second direction and in the first direction, respectively with the block in which the load corresponding to said one of the sensing nodes is located.

2. The heat-dissipation system according to claim 1, wherein the fan control circuit controls the fan module further according to a plurality of operating modes.

3. The heat-dissipation system according to claim 2, wherein the operating mode includes at least one of a silent mode, a power-saving mode, a high-performance mode, a single-processor mode, a multi-processor mode, a user-definable modes and a self-test mode.

4. The matrix thermal sensing circuit according to claim 1, wherein the calculation module calculates the heat generated by the load element according to the working current sensed by the sensing node and an efficiency lookup table.

5. The matrix thermal sensing circuit according to claim 4, wherein the efficiency lookup table includes input power and output power of each load element with different working current.

* * * * *